(12) United States Patent
Takabatake

(10) Patent No.: US 7,373,576 B2
(45) Date of Patent: May 13, 2008

(54) APPARATUS, METHOD, AND SIGNAL-BEARING MEDIUM EMBODYING A PROGRAM FOR VERIFYING LOGIC CIRCUIT DESIGN

(75) Inventor: Tadashi Takabatake, Tokyo (JP)

(73) Assignee: NEC Corporation, Tokyo (JP)

( * ) Notice: Subject to any disclaimer, the term of this patent is extended or adjusted under 35 U.S.C. 154(b) by 315 days.

(21) Appl. No.: 11/206,990

(22) Filed: Aug. 19, 2005

(65) Prior Publication Data
US 2006/0085713 A1 Apr. 20, 2006

(30) Foreign Application Priority Data
Sep. 30, 2004 (JP) ............................. 2004-288980

(51) Int. Cl.
G01R 13/28 (2006.01)
G06F 11/00 (2006.01)

(52) U.S. Cl. ................................................... 714/741

(58) Field of Classification Search ................. 714/741
See application file for complete search history.

(56) References Cited

U.S. PATENT DOCUMENTS 7,093,216 B2 * 8/2006 Nozuyama ..................... 716/4
7,143,376 B1 * 11/2006 Eccles .......................... 716/5

* cited by examiner

Primary Examiner—James C. Kerveros
(74) Attorney, Agent, or Firm—McGinn IP Law Group, PLLC

(57) ABSTRACT

A method and a signal-bearing medium embodying a program for a logic circuit design verification apparatus which includes a dynamic verification device that verifies a logic circuit executing a logic simulation, a static verification device that verifies the logic circuit executing a property verification, and a determination device that determines whether a test coverage includes an unverified part not verified by any of the dynamic verification device and the static verification device.

28 Claims, 4 Drawing Sheets

122 TO-BE-VERIFIED PART STORAGE PART

| INPUT/OUTPUT VARIABLE | CONDITION | FLAG INFORMATION |
|---|---|---|
| A, B, C, CLK | A=1,CLK=1, · · · · | 0 |
| A, B, C, CLK | · · · · | 1 |
| A, B, D | · · · · | 1 |
| A, B, D | · · · · | 0 |
| A, C, E, CLK · · · | · · · · | 1 |
| · · · · | · · · · | · · · · |

APPARATUS, METHOD, AND SIGNAL-BEARING MEDIUM EMBODYING A PROGRAM FOR VERIFYING LOGIC CIRCUIT DESIGN

FIELD OF THE INVENTION

The present invention relates to an apparatus, a method, and a signal-bearing medium embodying a program for verifying logic circuit designs by logic verification in a design step.

BACKGROUND OF THE INVENTION

In a conventional method of logic circuit verification, there are several types of logic circuit verification. One type is a logic simulation tool (as disclosed in Official gazette of JP-A No. 151297/1993 (pages 2 and 3, FIG. 1)), which is a dynamic verification tool and a second type is a property verification tool (as disclosed in Official gazette of JP-A No. 196342/2003 (pages 6 and 7, FIG. 1)), which is a static verification tool.

The logic simulation tool simulates an operation for each compiled RTL (Register Transfer Level) description by setting a test pattern and verifying whether or not signals are output as designed with respect to the test pattern.

The property verification tool uses Boolean algebra or the like to determine whether or not each logic circuit is described in accordance with the property (design specification), thereby verifying whether or not the logic circuit satisfies the property.

Logic circuit designers use a hardware description language (HDL) such as the VHDL (VHDIC Hardware Description Language), the Verilog-HDL language, or the like, or a programming language such as the C language, the Java® language, or the like to describe circuit operations. The logic simulation tool and the property verification tool are operated to verify whether or not the contents are described as the circuit operations are designed.

SUMMARY OF THE INVENTION

At present, logic circuit designers select one of the above-mentioned tools (i.e., the logic simulation tool and property verification tool) according to its purpose to verify logic circuits. However, because the verification principle differs between those tools (i.e., the logic simulation tool and the property verification tool), the test coverage has not been unified between the two tools. As a result, the logic circuit designers have not been able to recognize easily parts that are not verified by any of those tools (that is, verification failed parts).

Therefore, prior to the invention, a part of the object logic circuit, which has not been verified by any tools, has not been shown reliably to the logic circuit designer.

In view of the foregoing and other exemplary problems, drawbacks, and disadvantages of the conventional techniques, it is an exemplary feature of the present invention to provide an apparatus, a method, and a signal-bearing medium embodying a program for verifying logic circuits, which can use the same test coverage in both dynamic verification and static verification.

The present invention provides a logic circuit design verification apparatus. In accordance with the present invention, a controller comprises a dynamic verification device that verifies a logic circuit executing a logic simulation, a static verification device that verifies the logic circuit executing a property verification, and a determination device that determines whether a test coverage includes an unverified part not verified by any of the dynamic verification device and the static verification device.

The logic circuit design verification apparatus may further comprise a memory that stores the test coverage.

The logic circuit design verification apparatus may further comprise an output device that outputs the unverified part according to a result of determination by the determination device.

The dynamic verification device may verify whether the operation of the logic circuit is in accordance with its design specification using a test pattern.

The static verification device may verify whether each logic cone obtained by dividing the logic circuit by a design specification unit, satisfies an operation specified in its corresponding design specification by determining whether a description of the logic cone and its corresponding design specification are identical from a viewpoint of Boolean algebra.

A verified part verified by the dynamic verification device or the static verification device may be stored in a second memory, and the determination device may compare the test coverage with the verified part.

The logic circuit design verification apparatus may comprise a flag that denotes whether a part in the test coverage corresponding to the flag is verified by the dynamic verification device or the static verification device. The determination device may determine whether the test coverage includes an unverified part using the flag.

The test coverage may comprise a pair of a conditional expression that denotes a condition to cause a specific operation of the logic circuit and a variable name that denotes a signal related to the specific operation.

The logic circuit design verification apparatus may further comprise a logic circuit description storage that stores logic circuit design information that describes a relationship among connections of signal lines of a logic circuit and an operation of the logic circuit, and an extraction device that extracts the pair of the conditional expression and the variable name from a description of the logic circuit design information, and stores the pair in the test coverage. The determining device may determine each pair of a variable name and a conditional expression, which is stored in the test coverage and not verified yet, and the output device may output each unverified pair according to a result of determination by the determination device.

The logic circuit design verification apparatus may include a rate computing device that computes a rate of a number of unverified pairs of variable names and conditional expressions to all pairs stored in the test coverage according to the result of determination. The output device may further output the rate.

The determination device may determine other than any pair of a variable name and a conditional expression corresponding to an output of each operation determined by the dynamic verification device to be wrong from the viewpoint of a logic circuit design specification.

The determination device may not determine other than any pair of a variable name and a conditional expression corresponding to a description determined by the static verification device to be wrong from the viewpoint of a logic circuit design specification.

The determination device may include a deletion device that deletes a pair of a variable name and a conditional expression verified by the dynamic verification device or the static verification device from the test coverage. After the deletion device deletes the pair, the output device may output a pair having been stored in the test coverage.

The present invention also provides a logic circuit design verification apparatus which comprises means for dynamically verifying the logic circuit executing a logic simulation, means for statically verifying the logic circuit executing a property verification, and means for determining whether the test coverage includes a part not verified by the means dynamically verifying or the means for statically verifying.

The present invention also provides a method of verifying logic circuit design. In accordance with the present invention, the exemplary method comprise verifying dynamically a logic circuit executing a logic simulation, verifying statically the logic circuit executing a property verification, and determining whether the test coverage includes a part not verified by the verifying dynamically or the verifying statically.

The method may further comprise storing a test coverage.

The method may further comprise outputting an unverified part according to a result of the determining.

The method may comprise verifying whether the operation of a logic circuit is in accordance with its design specification using a test pattern.

The method may comprise verifying whether each logic cone obtained by dividing a logic circuit by a design specification unit satisfies an operation specified in its corresponding design specification by determining whether a description of the logic cone and its corresponding design specification are identical from a viewpoint of Boolean algebra.

The method may comprise storing a verified part verified dynamically or statically, and comparing the test coverage with the verified part.

The method may comprise determining whether the test coverage includes an unverified part using a flag denoting whether a part in the test coverage corresponding to the flag is verified dynamically or statically.

The test coverage may comprise a pair of a conditional expression that denotes a condition to cause a specific operation of the logic circuit and a variable name that denotes a signal related to the specific operation from a description of the logic circuit design information.

The method may further comprise storing logic circuit design information that describes a relationship among connections of signal lines of a logic circuit and an operation of the logic circuit, extracting the pair of the conditional expression and the variable name from the description of the logic circuit design information, and then storing the pair as the test coverage, determining each pair of a variable name and a conditional expression, which is stored in the test coverage and not verified yet, and outputting each unverified pair according to a result of determination.

The method may further comprise computing a rate of a number of unverified pairs of variable names and conditional expressions to all pairs stored according to a result of determination, and outputting the rate.

The method may comprise determining other than any pair of a variable name and a conditional expression corresponding to an output of each operation determined by the verifying dynamically to be wrong from a viewpoint of a logic circuit design specification.

The method may comprise determining other than any pair of a variable name and a conditional expression corresponding to description determined by the verifying statically to be wrong from a viewpoint of a logic circuit design specification.

The method may comprise deleting a pair of a variable name and a conditional expression dynamically or statically verified and stored when the pair is determined to be stored, and after deleting the pair, outputting a pair having been stored in the test coverage.

The present invention also provides a signal-bearing medium embodying a program of machine-readable instructions executable by a digital processing apparatus, the program causing a logic circuit design verification apparatus to perform a method of verifying logic circuit design, the method comprises verifying dynamically the logic circuit executing a logic simulation, verifying statically the logic circuit executing a property verification, and determining whether the test coverage comprises a part not verified by the verifying dynamically or the verifying statically.

The present invention also provides a logic circuit design verification apparatus that comprises a first verification device that verifies a logic circuit, a second verification device that verifies the logic circuit, and a determination device that determines whether a test coverage includes an unverified part not verified by any of the first verification device and the second verification device.

The first verification device may be a dynamic verification device that verifies a logic circuit executing a logic simulation.

The first verification device may be a static verification device that verifies the logic circuit executing a property verification.

The logic circuit design verification apparatus according to another exemplary aspect of the present invention includes: logic circuit description storage means for storing logic circuit design information that describes a relationship among connections of signal lines of a logic circuit and the operation of the logic circuit; extraction means for extracting a pair of a conditional expression that denotes a condition for causing a specific operation of the logic circuit and a variable name that denotes a signal related to the specific operation from the description of the logic circuit design information, then storing the pair in a coverage storage means; dynamic verification means for dynamically verifying whether or not the operation of the logic circuit is in accordance with its design specification using a test pattern; static verification means for statically verifying whether or not the operation of each logic cone obtained by dividing the logic circuit by a design specification unit satisfies an operation specified in its corresponding design specification by determining whether or not the description of the logic cone is identical with its corresponding design specification; determination means for determining whether or not a pair of a variable name and a conditional expression corresponding to each operation of the logic circuit verified by the dynamic or static verifying means is stored in the coverage storage means; and outputting means for determining each unverified pair of a variable name and a conditional expression stored in the coverage storage means, then outputting the unverified pair according to a result of determination by the determination means.

The above logic circuit design verification apparatus may include computing means for computing a rate of the number of pairs to all the pairs. Each of the pairs includes a variable name and a conditional expression, stored in the storage means, and determined not to be verified yet by the determination means.

In that connection, the outputting means comes to output the rate computed by the computing means.

In the above logic circuit design verification apparatus, the determination means may not determine a pair of a variable name and a conditional expression corresponding to an operation determined by the dynamic verification means to be a wrong one from the viewpoint of the logic circuit design specifications.

In the above logic circuit design verification apparatus, the determination means may not determine a pair of a variable name and a conditional expression corresponding to the description determined by the static verification means to be a wrong one from the viewpoint of the logic circuit design specifications.

In the above logic circuit design verification apparatus, the determination means may include deletion means for deleting a pair of a variable name and a conditional expression corresponding to an operation of a logic circuit verified by the dynamic or static verification means from the coverage storage means in case the pair is determined to be stored in the coverage storage means.

In that connection, the outputting means outputs the pair of the variable name and the conditional expression having been stored in the coverage storage means after an operation of the deletion means.

The logic circuit design verification method according to another exemplary aspect of the present invention includes: storing logic circuit design information that describes a relationship among connections of signal lines of a logic circuit and the operation of the logic circuit; extracting a pair of a conditional expression that denotes a condition for causing a specific operation of the logic circuit and a variable name that denotes a signal related to the specific operation from the description of the logic circuit design information, then storing the extracted pair in a coverage storage means; dynamically verifying whether or not the operation of the logic circuit is in accordance with its design specification of the logic circuit using a test pattern; statically verifying whether or not the operation of each logic cone obtained by dividing the logic circuit by a design specification unit satisfies an operation specified in its corresponding design specification by determining whether or not the description of the logic cone and its corresponding design specification are identical from the viewpoint of Boolean algebra; determining whether or not a pair of a variable name and a conditional expression corresponding to each operation of the logic circuit verified by the dynamic or static verifying means is stored in the coverage storage means; and determining each pair of a variable name and a conditional expression stored in the coverage storage means and not verified, then outputting the unverified pair according to a result of determination by the determination means.

A signal-bearing medium embodying program according to the another exemplary aspect of the present invention enables a computer system to function as a logic circuit design verification apparatus which includes: logic circuit description storage means for storing logic circuit design information that describes a relationship among connections of signal lines of a logic circuit and the operation of the logic circuit; extraction means for extracting a pair of a conditional expression that denotes a condition for causing a specific operation of the logic circuit and a variable name that denotes a signal related to the specific operation from the description of the logic circuit design information, then storing the extracted pair in a coverage storage means; dynamic verification means for dynamically verifying whether or not the operation of the logic circuit is in accordance with its design specification using a test pattern; static verification means for statically verifying whether or not the operation of each logic cone obtained by dividing the logic circuit by a design specification unit satisfies an operation specified in the corresponding design specification by determining whether or not the description of the logic cone and its corresponding design specification are identical from the viewpoint of Boolean algebra; determination means for determining whether or not a pair of a variable name and a conditional expression corresponding to each operation of the logic circuit verified by the dynamic or static verifying means is stored in the coverage storage means; and outputting means for determining each unverified pair of a variable name and a conditional expression stored in the coverage storage means, then outputting the unverified pair according to a result of determination by the determination means.

According to the present invention, when a logic circuit is to be verified by using both first and second tools (e.g. dynamic and static verification tools), the same test coverage is used for both of the first and second tools (e.g. dynamic and static verification tools). Consequently, any part of the object logic circuit, which has not been verified by any tools, can be shown reliably to the subject logic circuit designer.

BRIEF DESCRIPTION OF THE DRAWINGS

Novel and exemplary features believed characteristic of the invention are set forth in the appended claims. The invention itself, however, as well as other exemplary features and advantages thereof, will be best understood by reference to the detailed description which follows, read in conjunction with the accompanying drawings, wherein:

DETAILED DESCRIPTION OF THE EXEMPLARY EMBODIMENTS

Figure 1:
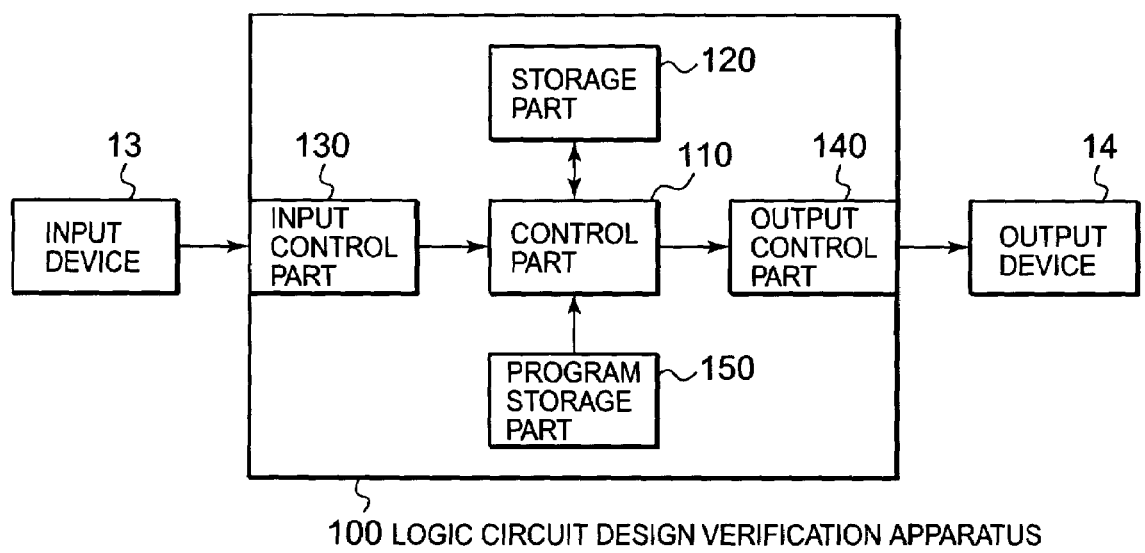
FIG. 1 is a block diagram of a logic circuit design verification apparatus 100 in an exemplary embodiment of the present invention.

Hereinbelow, exemplary embodiments of the present invention will be described with reference to the accompanying drawings. It is noted that the "memory," "second memory," "dynamic verification device," "static verification device," "determination device," "output device," "a pair of conditional expression," "extraction device," "logic circuit description storage," "rate computing device," and "deletion device" in the scope of the claims, are more concretely referred to as "to-be-verified part storage part 122," "verified part storage part," "dynamic verification part 112," "static verification part 113," "determination part 114 and outputting part 115," "output control part 140 and output device 14," "input/output variable and condition in FIG. 4," "analysis part 111," "RTL description storage part 121," "rate computing part 116," and "deletion part 117", respectively, in the following discussion.

FIG. 1 shows a block diagram of a logical circuit design supporting apparatus in the exemplary embodiment of the present invention.

Logic circuit design verification apparatus 100 in this embodiment verifies each logic circuit on the basis of the RTL (Register Transfer Level) described by the logic circuit designer, and outputs a message in case any unverified part is detected. Logic circuit design verification apparatus 100, when verifying an RTL description, performs both dynamic verification (e.g., logic simulation) and static verification (e.g., property verification). The logic circuit designer instructs logic circuit design verification apparatus 100 to read the object RTL described file (hereunder, to be referred to as "RTL file") and issues a verification request. The logic circuit to be verified is usually divided into a plurality of RTL files, so that logic circuit design verification apparatus 100 is configured to accept the plurality of RTL files.

As shown in FIG. 1, logic circuit design verification apparatus 100 in this exemplary embodiment includes control part 110, storage part 120, input control part 130, output control part 140, and program control part 150. Input control part 130 is connected to input device 13 and the output part 140 is connected to an output device 14, respectively.

Figure 2:
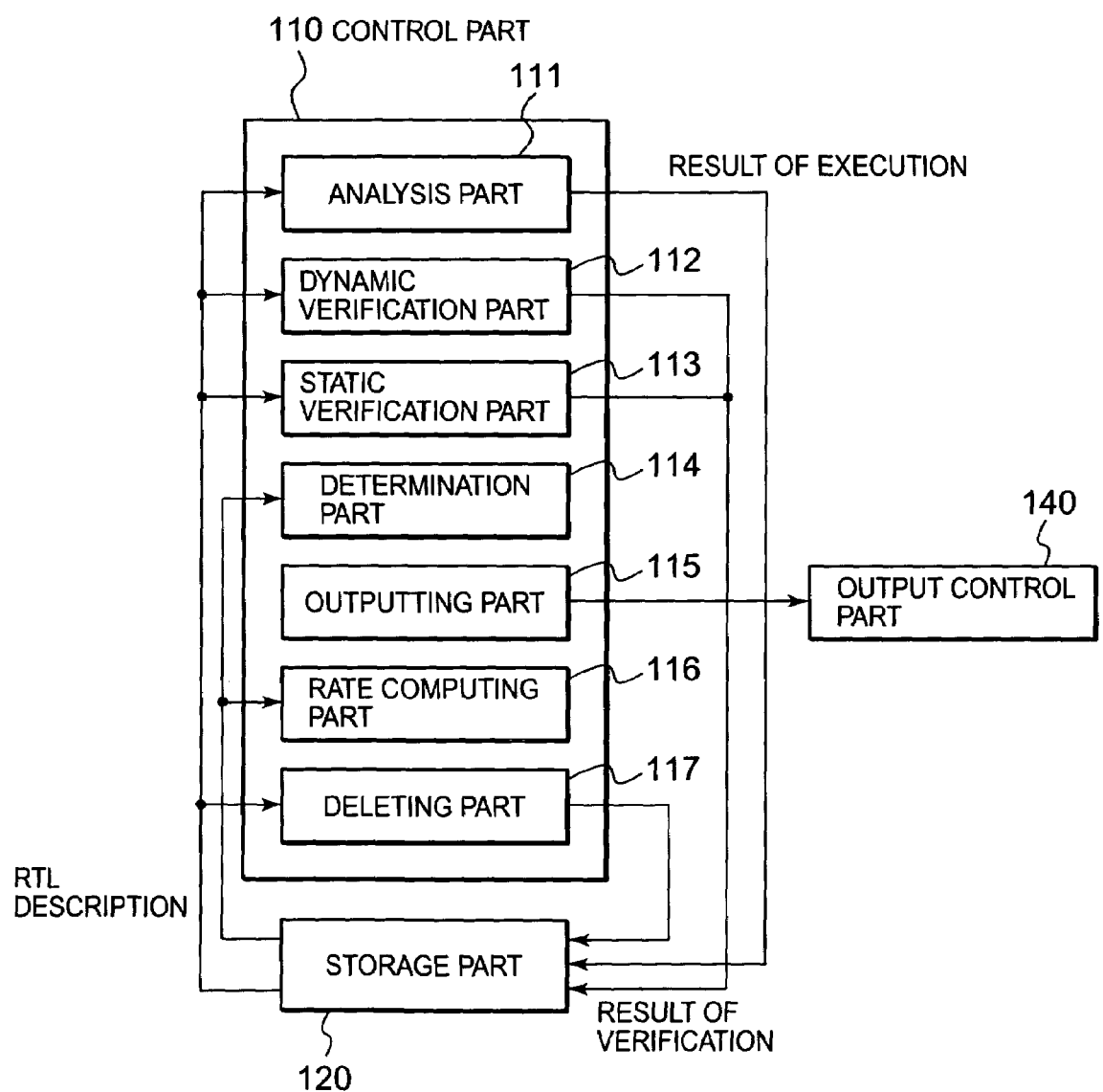
FIG. 2 is an exemplary functional block diagram of the functions executed by a control part 110 shown in FIG. 1.

FIG. 2 shows an exemplary functional block diagram of the functions executed by a control part 110 shown in FIG. 1. Control part 110 includes a central processing unit (CPU) and a storage device (RAM: Random Access Memory) used as a work area, etc., for example. Control part 110 runs an operation program stored in program storage part 150 in FIG. 1, for example, to drive analysis part 111, dynamic verification part 112, static verification part 113, determination part 114, outputting part 115, rate computing part 116, and a deletion part 117 Control part 110 executes an RTL description verification processing to be described later while controlling each part of logic circuit design verification apparatus 100.

Analysis part 111 reads an RTL file stored in storage part 120 to make a syntax analysis for the contents described in the RTL file to extract all the pairs including a variable name (e.g., a name given to an input or output signal) and a conditional expression respectively, and then stores the extracted pairs in to-be-verified part storage part 122 to be described later.

A conditional expression mentioned above may refer to a conditional expression used to activate part of a logic circuit and enable the part to output a specific output signal. For example, in the case of the VHDL, such a conditional expression is included in an if statement, case statement, or the like. If descriptions of a plurality of conditional expressions are nested, then logic circuit design verification apparatus 100 employs logic products of a plurality of conditional expressions. When the same variable name is used in variables used in different RTL files, and in case those variables are not global ones, logic circuit design verification apparatus 100 regards those variables as different variables. Consequently, in RTL files to be verified, each pair of a variable and a conditional expression is ensured to be unique.

Dynamic verification part 112 reads both of an RTL file stored in storage part 120 and a test pattern stored in test pattern storage part 124 (to be described later) to make a logic simulation, that is a dynamic verification. Then, dynamic verification part 112 stores the verified pair in verified part storage part 123 (to be described later). If the output operation is not as expected by the design specification, then dynamic verification part 112 instructs output control part 140 to output the effect message and the pair of the variable and the conditional expression to output device 14 through output control part 140.

If dynamic verification part 112 begins the logic simulation, then some parts of the logic circuit are activated in each test pattern simulation. Dynamic verification part 112 stores the pair of the variable and the conditional expression that features a circuit corresponding to each of the activated parts in verified part storage part 123 as a verified pair.

As described above, the logic simulation tool recognizes a variable and a conditional expression in each RTL file activated by a test pattern to be verified at each event occurrence. Logic circuit design verification apparatus 100 can thus use such a verification result as measured data of a test coverage.

Static verification part 113 reads RTL file stored in storage part 120 to execute property verification (e.g., static verification) for each divided logic cone for each property. Static verification part 113 then stores both variable and conditional expressions that are verified in verified part storage part 123. In case a logic cone is not output as designed, (e.g., the logic cone operation does not match with the operation specified in its corresponding design specification from the viewpoint of Boolean algebra), static verification part 113 instructs output control part 140 to output a pair of a variable and a conditional expression corresponding to the logic cone to output device 14.

A logic cone mentioned above may refer to a combination circuit required to determine the logic of an output signal. The logic cone may be represented by a Boolean expression.

If property verification is made (e.g., by using a static verification tool), then all of the variables and conditional expressions included in a divided logic cone for each property are verified comprehensively with a mathematical verification algorithm. Logic circuit design verification apparatus 100 can thus use the verification result as test coverage measured data as is.

Figure 5:
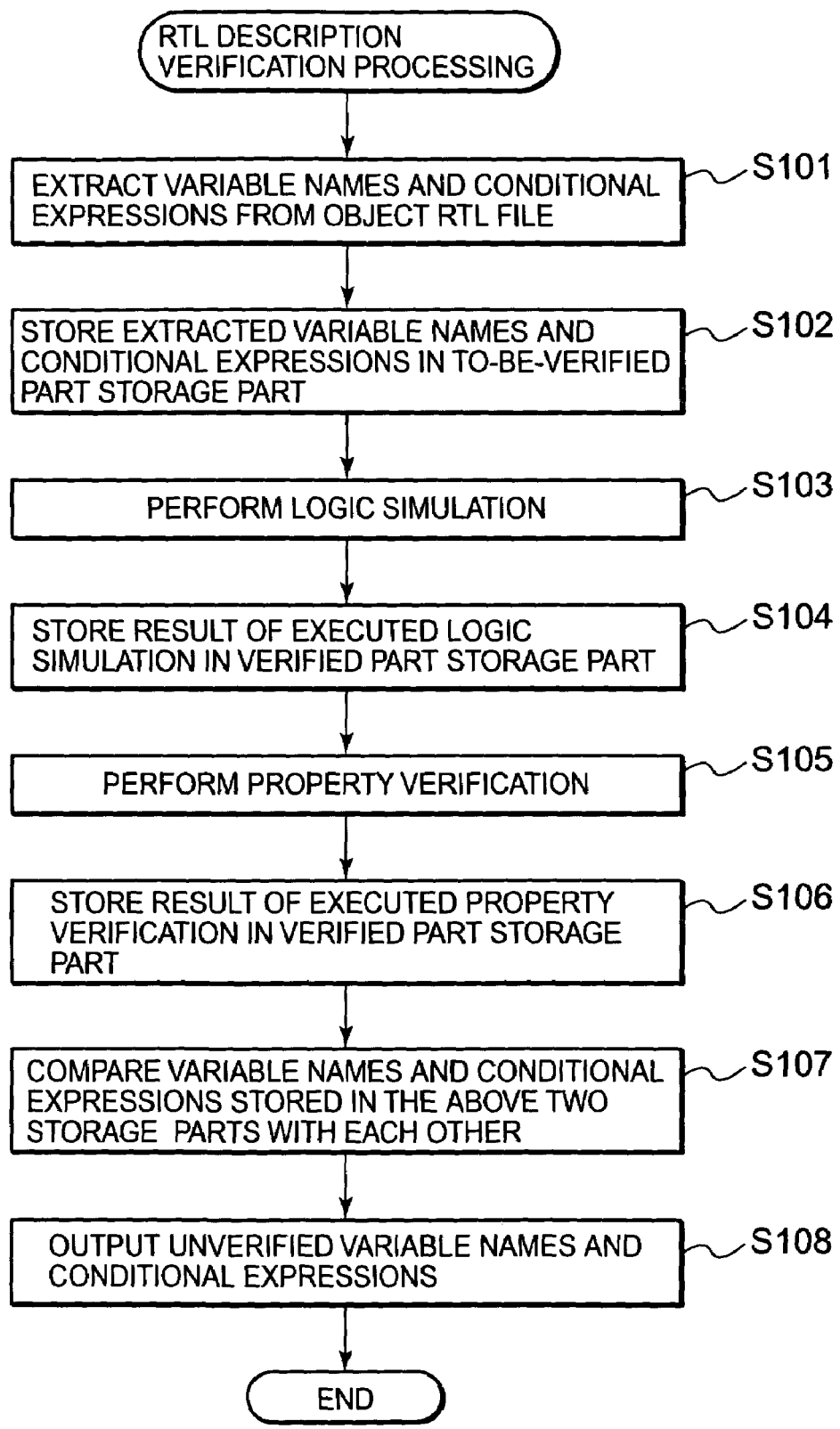
FIG. 5 is an exemplary flowchart of an RTL verification processing in an exemplary embodiment of the present invention.

Determination part 114, outputting part 115, rate computing part 116, and deletion part 117 will be explained in the description of a flowchart of an RTL verification processing in FIG. 5

Figures 3, 4:
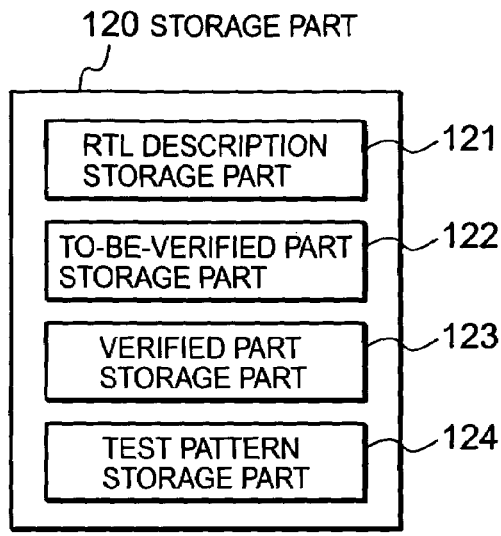
FIG. 3 is an exemplary chart for describing the data to be stored in a storage part 120 shown in FIG. 1.
FIG. 4 is an exemplary chart for describing to-be-verified information to be stored in a to-be-verified part storage part 122 shown in FIG. 3.

Returning now to FIG. 1, storage part 120 is configured by such a storage device as a hard disk drive or the like and stores RTL files to be verified, as well as temporary data generated in RTL description verification processings. FIG. 3 shows an exemplary chart for describing the data to be stored in storage part 120 shown in FIG. 1, namely, how data is to be stored in storage part 120. The storage part includes RTL description storage part 121, to-be-verified part storage part 122, verified part storage part 123, and test pattern storage part 124.

RTL description storage part 121 stores RTL files to be verified. RTL files are described with a hardware description language (HDL).

To-be-verified part storage part 122 stores all the pairs including a variable and a conditional expression respectively, described in each RTL file stored in RTL description storage part 121. Those pairs are extracted by analysis part 111 with respect to each logic cone.

FIG. 4 shows an example of "to-be-verified information" to be stored in to-be-verified part storage part 122. As shown in FIG. 4, to-be-verified part storage part 122 may store the "information to be verified" in a tabular format or the like. The "information to be verified" includes items of "input/output variable", "conditional expression", and "flag information". In this "information to be verified", the "input/output variable" and the "conditional expression" are combined uniquely.

The "input/output variable" mentioned above may refer to a list of names of input/output variables (signals) related to a part of a logic circuit. "Conditional expression" may refer to a list of expressions for denoting conditions to activate the part of the logic circuit. The "flag information" may refer to information used to identify whether or not the part of the logical circuit is already verified. The "flag information" corresponding to a pair of "an input/output variable" and "a conditional expression" may have an initial value that means "unverified" (for example, "0"). The unverified value is rewritten preferably to a verified value (for example, "1") by an RTL description verification processing to be described later with reference to FIG. 5.

Returning now to FIG. 3, verified part storage part 123 stores each pair of a variable and a conditional expression verified by dynamic verification part 112 and static verification part 113, respectively. An example of how to store such a pair is the same as the example of the to-be-verified information to be stored in to-be-verified part storage part 122 shown in FIG. 4 except that the "flag information" is not stored.

Test pattern storage part 124 stores test patterns to be used to verify RTL files through logic simulation. Test patterns to be stored in test pattern storage part 124 may be created manually or may be generated automatically from each RTL file with use of a test pattern automatic generation tool.

Returning to FIG. 1 again, input control part 130 connects input device 13 such as a keyboard, pointing device, or the like and accepts instructions inputted from input device 13 and to be transferred to control part 110, and then transfers the instructions to control part 110.

Output control part 140 is connected to output device 14 such as a display, etc., and outputs processing results of control part 110 to output device 14 as needed.

Program storage part 150 is configured by a storage device such as a ROM (Read Only Memory) or the like, and stores operation programs to be executed by control part 110. The operation programs stored in program storage part 150 are, for example, a logic simulation tool used for dynamic verification of logic circuits, a property verification tool used for static verification, a tool for extracting each pair of a variable and a conditional expression from RTL files, and the like. If a test pattern is to be generated automatically by using the test pattern automatic generation tool, then program storage part 150 also stores the test pattern automatic generation tool.

Next, a description will be made for the operation of logic circuit design verification apparatus 100 in this exemplary embodiment with reference to a drawing. FIG. 5 is an exemplary flowchart for describing an RTL description verification processing of logic circuit design verification apparatus 100 in this exemplary embodiment.

Each subject logic circuit designer creates an RTL file to be verified and stores the RTL file in RTL description storage part 121. Then, the designer creates a test pattern used for logic verification of the RTL file or the RTL file is generated automatically, and then stores the same in test pattern storage part 124.

Receiving an instruction for verifying an RTL description from the subject logic circuit designer, which is inputted through input device 13, logic circuit design verification apparatus 100 starts a RTL description verification processing. A well-known method such as command line inputs and interactive ones is used to accept the instruction.

First, analysis part 111 reads an RTL file to be verified from RTL description storage part 121, and extracts every pair of a variable and a conditional expression from the RTL description storage part 121 (step S101). Then, those pairs are stored in to-be-verified part storage part 122 (step S102).

First (e.g., Dynamic) verification part 112 then performs verification (e.g., logical simulation) according to the RTL description, as well as the test pattern stored in test pattern storage part 124 (step S103), and then stores a pair of a variable name and a conditional expression corresponding to the activated circuit part in verified part storage part 123 (step S104). If the output is not as expected from a test pattern in step S103, then first (e.g., dynamic) verification part 112 outputs an error message, as well as the pair of the variable name and the conditional expression to output device 14.

Thereafter, a second (e.g., static) verification part 113 of control part 110 performs second (e.g., property) verification according to the RTL description (step S105), and then stores each pair of a variable name and a conditional expression that operates as designed among all the pairs included in a logic cone divided by a property unit in verified part storage part 123 (step S106).

If the same pair of a variable name and a conditional expression is already stored in step S104, then one of them is registered as a representative one. If any pair does not operate as designed in step S105, then second (e.g., static) verification part 113 outputs the message of the disabled operation, as well as the pair of the variable name and the conditional expression to output device 14.

Thereafter, determination part 114 of control part 110 determines whether the pair of the variable name and the conditional expression stored in verified part storage part 123 in steps S104 and S106 is included in the pairs of variable names and conditional expressions stored in to-be-verified part storage part 122. If the pair is included, then control part 110 updates the "flag information" in to-be-verified part storage part 122, corresponding to the variable name and the conditional expression to the information for denoting that the variable name and the conditional expression is verified (step S107).

Finally, outputting part 115 of control part 110 determines each unverified pair of a variable name and a conditional expression according to whether or not "verified" is set in the "flag information" stored in to-be-verified part storage part 122 together with the variable name and the conditional expression. Then, control part 110 outputs the unverified pair to output device 14 through output control part 140 (step S108). Finally, control part 110 exits the description verification processing.

The logic circuit designer refers to the output result to correct the RTL description and adds necessary test patterns and instructs logic circuit design verification apparatus 100 to execute the RTL description verification processing again. With those repetitive processes, the RTL description is refined.

It is noted that the order of the first and second verification processes can be easily reversed. Thus, for example, (second) static verification could be performed first, prior to dynamic verification.

As described above, according to the logic circuit design verification apparatus in the exemplary embodiment of the present invention, the test coverage of the logic simulation including dynamic verification and the test coverage of the property verification tool including static verification can be unified into one (e.g., integrated). Consequently, each part which is unverified by any of the tools can be shown clearly, thereby improving the design error detection effect in RTL.

However, the present invention is not limited only to the above exemplary embodiment. It is to be understood that modifications will be apparent to those skilled in the art without departing from the spirit of the invention.

For example, logic circuit design verification apparatus 100 may be configured as a client server system. In such a configuration, the logic circuit designer comes to execute the above functions by accessing each object server device through a communication network from a client device. The execution result is output from the client device.

Logic circuit design verification apparatus 100 also may apply to a combination with another design verification method of logical circuits, such as a static timing verification tool in addition to the combination of logic simulation and property verification.

And, although unverified variable names and conditional expressions are output in step S108, rate computing part 116 of control part 110 computes data denoting a rate of the number of unverified pairs of variable names and conditional expressions (hereinafter, to be referred to as a "verified rate"), rate computing part 116 may output the data instead of those items (e.g., the unverified variable names and conditional expressions).

Any index may be used as the verified coverage rate. For example, the number of pairs of variable names and conditional expressions registered in step S102 may be adopted as a denominator of unified coverage measurement and the number of pairs of variable names and conditional expressions registered in steps S104 and S106 may be used as a numerator of the same to obtain a verification coverage rate.

In case the operation of a part of a logic circuit is not the same as the design specification in steps S104 and S106, dynamic verification part 112 and static verification part 113 may be configured not to store the pair of the variable name and the conditional expression in verified part storage part 123.

It is also possible not to store each verified pair of a variable name and a conditional expression in verified part storage part 123 in steps S104 and S106 and search each pair of a variable name and a conditional expression stored in to-be-verified part storage part 122 to update the "flag information" corresponding to the pair.

Deletion part 117 may delete variable names and conditional expressions stored in verified part storage part 123 in steps S104 and S106 from those stored in to-be-verified part storage part 122 in step S102 so that those verified variable names and conditional expressions are discriminated from those that are unverified. In such a case, there is no need to store the "flag information" of each pair.

It is also possible to output each part unverified in step S104 or in both steps S104 and S106, in step S108. Thus, as the "flag information", both information for denoting whether or not the verification is done in dynamic verification and information for denoting whether or not verification is done in static verification, may be stored.

The information processing apparatus for realizing logic circuit design verification apparatus 100 in this embodiment of the present invention may not be a dedicated system. It may be an ordinary computer system. For example, logic circuit design verification apparatus 100 may be configured to execute the above processings using a program installed in program storage part 150 from a medium (CD-ROM or the like) that stores the program for executing the above processings.

If the above functions are divided between an OS (Operating System) and any application program or the OS and the application cooperate to execute the above functions, then only the application may be stored in a medium.

Programs can be superposed on carrier waves and distributed through a communication network. For example, a program may be displayed on a BBS (Bulletin Board System) of a communication network and distributed through the network. Logic circuit design verification apparatus 100 may also be configured so that the program is started up and executed just like the application program under the control of the operating system to execute the above processing.

While this invention has been described with reference to exemplary embodiments, this description is not intended as limiting. Various modifications of the exemplary embodiments, as well as other embodiments of the invention, will be apparent to persons skilled in the art upon taking the description as a whole. It is, therefore, contemplated that the appended claims will cover any such modifications or embodiments as fall within the true scope of the invention.

Further, the inventor's intent is to encompass all equivalents of all the elements of the claimed invention even if the claims are amended during prosecution.

What is claimed is:

1. A logic circuit design verification apparatus, comprising:
    a dynamic verification device that verifies a logic circuit executing a logic simulation;
    a static verification device that verifies said logic circuit executing a property verification; and
    a determination device that determines whether a test coverage includes an unverified part not verified by said dynamic verification device and by said static verification device, by using a flag denoting whether a part in said test coverage corresponding to said flag is verified by said dynamic verification device or said static verification device.

2. The logic circuit design verification apparatus, according to claim 1, further comprising:
    a memory that stores said test coverage.

3. The logic circuit design verification apparatus, according to claim 1, further comprising:
    an output device that outputs said unverified part according to a result of determination by said determination device.

4. The logic circuit design verification apparatus, according to claim 3, wherein said test coverage comprises:
    a pair of a conditional expression that denotes a condition to cause a specific operation of said logic circuit and a variable name that denotes a signal related to said specific operation.

5. The logic circuit design verification apparatus, according to claim 4, further comprising:
    a logic circuit description storage that stores logic circuit design information that describes a relationship among connections of signal lines of a logic circuit and an operation of said logic circuit; and
    an extraction device that extracts said pair of said conditional expression and said variable name from a description of said logic circuit design information, and stores said pair in said test coverage,
    wherein said determining device determines each pair of a variable name and a conditional expression, which is stored in said test coverage and not verified yet, and said output device outputs each unverified pair according to a result of determination by said determination device.

6. The logic circuit design verification apparatus according to claim 5, wherein said logic circuit design apparatus includes:
    a rate computing device that computes a rate of a number of unverified pairs of variable names and conditional expressions to all pairs stored in said test coverage according to said result of determination,
    wherein said output device further outputs said rate.

7. The logic circuit design verification apparatus according to claim 5,
wherein said determination device determines other than any pair of a variable name and a conditional expression corresponding to an output of each operation determined by said dynamic verification device to be wrong from a viewpoint of a logic circuit design specification.

8. The logic circuit design verification apparatus according to claim 5,
wherein said determination device determines other than any pair of a variable name and a conditional expression corresponding to an description determined by said static verification device to be wrong from a viewpoint of a logic circuit design specification.

9. The logic circuit design verification apparatus according to claim 5, wherein said determination device includes:
a deletion device that deletes a pair of a variable name and a conditional expression verified by said dynamic verification device or said static verification device from said test coverage; and
wherein, after said deletion device deletes said pair, said output device outputs a pair having been stored in said test coverage.

10. The logic circuit design verification apparatus, according to claim 1,
wherein said dynamic verification device verifies whether said operation of said logic circuit is in accordance with its design specification using a test pattern.

11. The logic circuit design verification apparatus, according to claim 1,
wherein said static verification device verifies whether each logic cone obtained by dividing said logic circuit by a design specification unit, and represented by a Boolean expression, satisfies an operation specified in its corresponding design specification by determining whether a Boolean algebra corresponding to an operation of said logic cone and a Boolean algebra of its corresponding design specification are identical.

12. The logic circuit design verification apparatus, according to claim 1,
wherein a verified part verified by said dynamic verification device or said static verification device is stored in a second memory, and said determination device compares said test coverage with said verified part.

13. A method of verifying logic circuit design, comprising;
verifying dynamically a logic circuit executing a logic simulation;
verifying statically said logic circuit executing a property verification; and
determining whether said test coverage includes a part not verified by said verifying dynamically and by said verifying statically, by using a flag denoting whether said part in said test coverage corresponding to said flag is verified by said verifying dynamically or said verifying statically.

14. The method of verifying logic circuit design, according to claim 13, further comprising:
storing a test coverage.

15. The method of verifying logic circuit design, according to claim 13, further comprising:
outputting an unverified part according to a result of said determining.

16. The method of verifying logic circuit design, according to claim 15, wherein said test coverage comprises:
a pair of a conditional expression that denotes a condition to cause a specific operation of said logic circuit and a variable name that denotes a signal related to said specific operation from a description of said logic circuit design information.

17. The method of verifying logic circuit design, according to claim 16, further comprising:
storing logic circuit design information that describes a relationship among connections of signal lines of a logic circuit and an operation of said logic circuit; and
extracting said pair of said conditional expression and said variable name from the description of said logic circuit design information, and then storing said pair as said test coverage;
determining each pair of a variable name and a conditional expression, which is stored in said test coverage and not verified yet; and
outputting each unverified pair according to a result of determination.

18. The method of verifying logic circuit design, according to claim 16, further comprising:
computing a rate of a number of unverified pairs of variable names and conditional expressions to all pairs stored according to a result of determination; and
outputting said rate.

19. The method of verifying logic circuit design, according to claim 16, comprising:
determining other than any pair of a variable name and a conditional expression corresponding to an output of each operation determined by said verifying dynamically to be wrong from a viewpoint of a logic circuit design specification.

20. The method of verifying logic circuit design, according to claim 13, comprising:
verifying whether said operation of a logic circuit is in accordance with its design specification using a test pattern.

21. The method of verifying logic circuit design, according to claim 13, comprising:
verifying whether each logic cone obtained by dividing a logic circuit by a design specification unit and represented by a Boolean expression, satisfies an operation specified in its corresponding design specification by determining whether a Boolean algebra corresponding to an operation of said logic cone and a Boolean algebra of its corresponding design specification are identical.

22. The method of verifying logic circuit design, according to claim 13, comprising:
storing a verified part verified dynamically or statically; and
comparing said test coverage with said verified part.

23. The method of verifying logic circuit design, according to claim 22, comprising:
determining other than any pair of a variable name and a conditional expression corresponding to description determined by said verifying statically to be wrong from a viewpoint of a logic circuit design specification.

24. The method of verifying logic circuit design, according to claim 22, comprising:
deleting a pair of a variable name and a conditional expression dynamically or statically verified and stored when said pair is determined to be stored; and
after deleting said pair, outputting a pair having been stored in said test coverage.

25. A signal-bearing medium embodying a program of machine-readable instructions executable by a digital processing apparatus, said program causing a logic circuit design verification apparatus to perform a method of verifying logic circuit design, said method comprising:

verifying dynamically said logic circuit executing a logic simulation;

verifying statically said logic circuit executing a property verification; and determining whether said test coverage comprises a part not verified by said verifying dynamically and by said verifying statically, by using a flag denoting whether said part in said test coverage corresponding to said flag is verified by said verifying dynamically or said verifying statically.

26. A logic circuit design verification apparatus, comprising:

a first verification device that verifies a logic circuit;

a second verification device that verifies said logic circuit; and a determination device that whether a test coverage includes an unverified part not verified by said first verification device and by said second verification device, by using a flag denoting whether a part in said test coverage corresponding to said flag is verified by said first verification device or said second verification device.

27. The logic circuit design verification apparatus, according to claim 26, wherein said first verification device comprises a dynamic verification device that verifies a logic circuit executing a logic simulation.

28. The logic circuit design verification apparatus, according to claim 26, wherein said first verification device comprises a static verification device that verifies said logic circuit executing a property verification.

\* \* \* \* \*